US007952276B2

(12) United States Patent
Lee et al.

(10) Patent No.: US 7,952,276 B2
(45) Date of Patent: May 31, 2011

(54) ORGANIC LIGHT EMITTING DISPLAY AND METHOD OF MANUFACTURING THE SAME

(75) Inventors: Sung-Soo Lee, Suwon-si (KR); Chang-Woong Chu, Suwon-si (KR); Jin-Koo Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 51 days.

(21) Appl. No.: 12/421,621

(22) Filed: Apr. 9, 2009

(65) Prior Publication Data

US 2010/0019660 A1 Jan. 28, 2010

(30) Foreign Application Priority Data

Jul. 23, 2008 (KR) .................. 10-2008-0071763

(51) Int. Cl.
*H01J 1/62* (2006.01)
*H01J 63/04* (2006.01)
(52) U.S. Cl. ........ 313/512; 313/483; 313/498; 313/500; 313/501; 313/504; 313/505; 313/506
(58) Field of Classification Search ............... None
See application file for complete search history.

(56) References Cited

U.S. PATENT DOCUMENTS

| 7,443,093 | B2* | 10/2008 | Jianpu et al. | 313/500 |
| 2005/0012445 | A1* | 1/2005 | Yamazaki et al. | 313/500 |
| 2005/0218792 | A1* | 10/2005 | Jianpu et al. | 313/502 |
| 2007/0241690 | A1* | 10/2007 | Smith | 315/169.2 |

* cited by examiner

*Primary Examiner* — Nimesh Patel
*Assistant Examiner* — Natalie K Walford
(74) *Attorney, Agent, or Firm* — Innovation Counsel LLP (57) ABSTRACT

In a method of manufacturing an organic light emitting display, an organic light emitting layer and a second electrode are sequentially formed on a first sub-electrode, and a laser beam is irradiated onto the organic light emitting layer to partially remove the organic light emitting layer, so that the first sub-electrode is electrically connected to the second electrode. Thus, even though the second electrode is formed to have a small thickness in order to maximize an amount of light that is generated by the organic light emitting layer and exits to an exterior through the second electrode, the second electrode is electrically connected to the first sub-electrode, thereby reducing an electrical resistance of the second electrode.

9 Claims, 11 Drawing Sheets

ORGANIC LIGHT EMITTING DISPLAY AND METHOD OF MANUFACTURING THE SAME

CROSS-REFERENCE TO RELATED APPLICATION

This application relies for priority upon Korean Patent Application No. 2008-0071763 filed on Jul. 23, 2008, the contents of which are herein incorporated by reference in its entirety.

BACKGROUND

1. Field of the Invention

The present invention relates to an organic light emitting display and a method of manufacturing the organic light emitting display. More particularly, the present invention relates to an organic light emitting display having improved display quality and a method of manufacturing the organic light emitting display.

2. Description of the Related Art

In recent times, an organic light emitting display (OLED) has been widely used as a flat panel display.

The OLED, in general, includes an organic light emitting layer, an upper electrode arranged above the organic light emitting layer, and a lower electrode arranged below the organic light emitting layer. The OLED displays an image using a light that is generated by the organic light emitting layer when an electric potential difference occurs between the upper electrode and the lower electrode.

Meanwhile, the OLED is classified into a top emission type OLED and a bottom emission type OLED. In the case of the top emission type OLED, a light generated by the organic light emitting layer transmits through the upper electrode and exits to an exterior. In the case of the bottom emission type OLED, a light generated by the organic light emitting layer is reflected from the upper electrode, and the reflected light from the upper electrode transmits through the lower electrode and exits to an exterior of the OLED.

In the case of the top emission type OLED, the upper electrode is formed to have a small thickness to maximize an amount of light exiting to the exterior, thereby improving the display quality thereof. To this end, it is desirable for the upper electrode to include a transparent conductive material and to be formed with a small thickness. However, as the thickness of the upper electrode becomes thin, an electrical resistance of the upper electrode increases. As a result, an electrical conductivity of the upper electrode decreases, thereby deteriorating a display quality of the OLED.

SUMMARY

An embodiment of the present invention provides a method of manufacturing an organic light emitting display having an improved display quality.

Another embodiment of the present invention also provides an organic light emitting display having an improved display quality.

In another embodiment of the present invention, a method of manufacturing an organic light emitting display is provided as follows.

A first electrode is formed on a first substrate, a first sub-electrode that is spaced apart from the first electrode is formed on the first substrate, and a bank pattern, including a first opening corresponding to the first electrode and a second opening corresponding to the first sub-electrode, is formed on the first substrate. After forming the bank pattern, an organic light emitting layer is formed on the first electrode and the first sub-electrode. Then, a second electrode is formed on the organic light emitting layer, and the first substrate is combined with a second substrate.

After combining the first substrate with the second substrate, a laser beam is irradiated to electrically connect the first sub-electrode and the second electrode. Thus, a resistance of the second electrode may be reduced, and the second electrode may be formed to have a small thickness in order to maximize an amount of light that is generated by the organic light emitting layer and exits to an exterior through the second electrode and the second substrate.

In another embodiment of the present invention, an organic light emitting display includes a first substrate, a second substrate facing the first substrate, a first electrode disposed on the first substrate, and a first sub-electrode disposed on the first substrate and spaced apart from the first electrode.

In addition, the organic light emitting display includes a bank pattern including a first opening corresponding to the first electrode and a second opening corresponding to the first sub-electrode. The bank pattern is disposed on the first substrate. In addition, the organic light emitting display includes an organic light emitting layer disposed in the first opening and the second opening, and a second electrode disposed on the organic light emitting layer. The organic light emitting layer is contacted to the first sub-electrode.

According to the above, since the second electrode is electrically connected to the first sub-electrode by using irradiation of the laser beam, an electrical resistance of the second electrode is reduced, thereby improving an electrical conductivity of the second electrode. In addition, since an area between the first substrate and the second substrate is filled by a filling layer, foreign substances generated during the irradiation of the laser beam may be prevented from being diffused between the first substrate and the second substrate.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
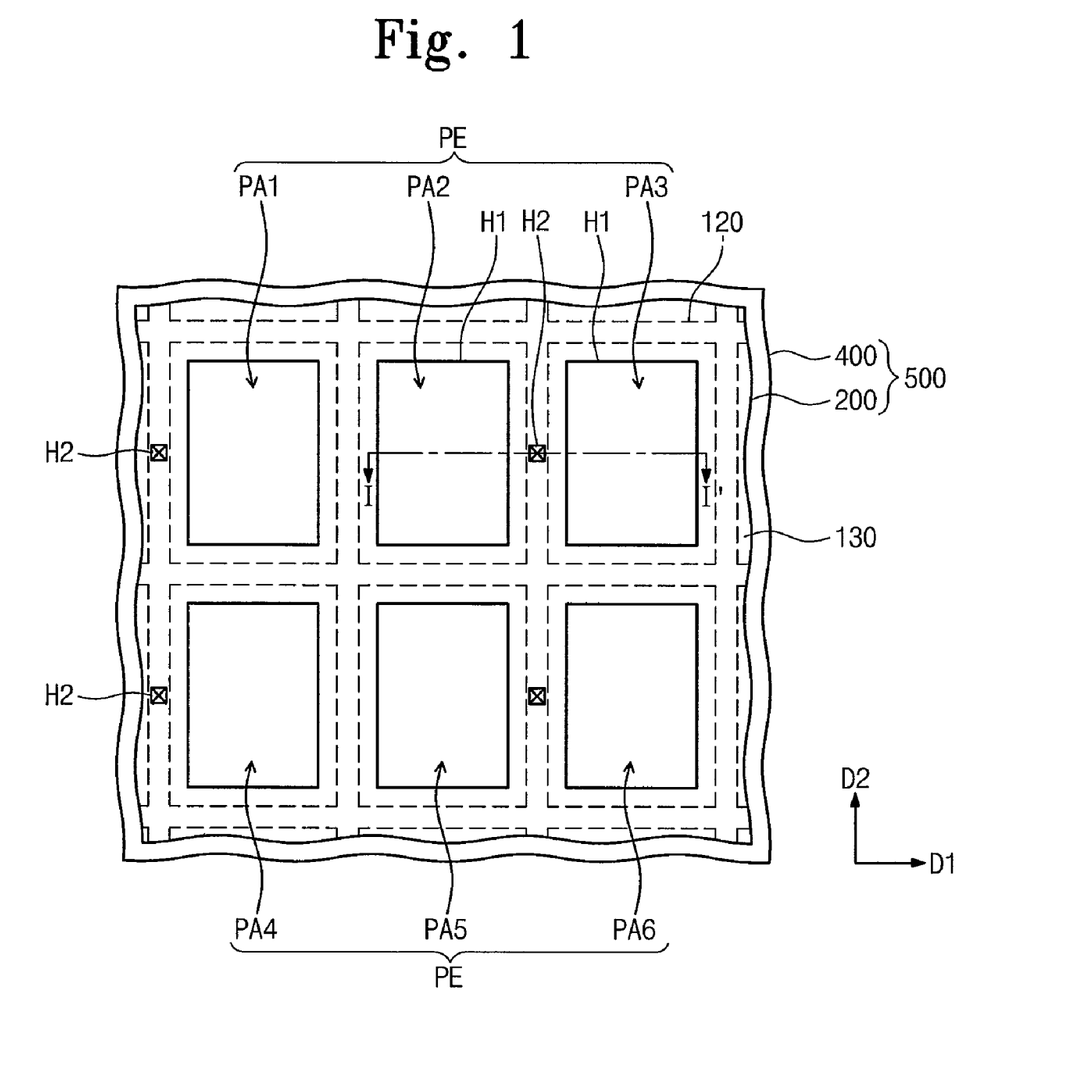
FIG. 1 is a plan view showing an embodiment of an organic light emitting display according to the present invention.

FIG. 1 is a plan view showing an embodiment of an organic light emitting display according to the present invention.

Referring to FIG. 1, an organic light emitting display (OLED) 500 includes a first substrate 200 and a second substrate 400 facing the first substrate 200.

The first substrate 200 includes a plurality of pixel areas defined thereon. For example, pixel areas PE including first to sixth pixel areas PA1, PA2, PA3, PA4, PA5, and PA6 are shown in FIG. 1. When viewed in a plan view, the pixel areas PE are arranged in a first direction D1 and a second direction D2 that is substantially perpendicular to the first direction D1.

Although not shown in detail in FIG. 1, a first electrode 110 (shown in FIG. 2) is arranged corresponding to each pixel area PE. In addition, an organic light emitting layer 140 (shown in FIG. 2) is arranged on the first electrode, and a second electrode 150 (shown in FIG. 2) is arranged on the organic light emitting layer. That is, the organic light emitting layer 140 is interposed between the first electrode 110 and the second electrode 150 in the pixel areas. Thus, a light having a predetermined color is generated by the organic light emitting layer in response to an electric potential difference between the first electrode 110 and the second electrode 150, so that the predetermined color of the light is displayed through the pixel areas PE.

In the present embodiment, the predetermined color may be white. However, in case that the first substrate 200 or the second substrate 400 further includes color filters (not shown) that are arranged corresponding to the pixel areas PE, other colors besides white, such as red, blue, and green, may be displayed in the pixel areas PE. For example, if the second substrate 400 further includes a red color filter that is arranged corresponding to the first pixel area PA1, the red color may be displayed in the first pixel area PA1.

Meanwhile, a first sub-electrode 120 that extends in the first direction D1 and the second direction D2 is arranged in an area outside the pixel areas PE. The first sub-electrode 120 is formed to surround each pixel area PE, and the first sub-electrode 120 does not overlap the pixel areas PE in a plan view. Therefore, an aperture ratio of the organic light emitting display 500 may be prevented from being lowered due to the first sub-electrode 120.

A bank pattern 130 is arranged on the first sub-electrode 120. A first opening H1 is formed through the bank pattern 130 corresponding to each pixel area PE. Since the first opening H1 is formed through the bank pattern 130, the first electrode 110 may directly make contact with the organic light emitting layer 140. A more detailed description of the above will be described with reference to FIG. 2.

In addition, a second opening H2 is formed through the bank pattern 130 such that the first sub-electrode 120 is partially exposed through the second opening H2. Although not shown in FIG. 1, since the second electrode 150 (shown in FIG. 2) is arranged at an uppermost position of the first substrate 200, the first sub-electrode 120 may be electrically connected to the second electrode through the second opening H2.

Figure 2:
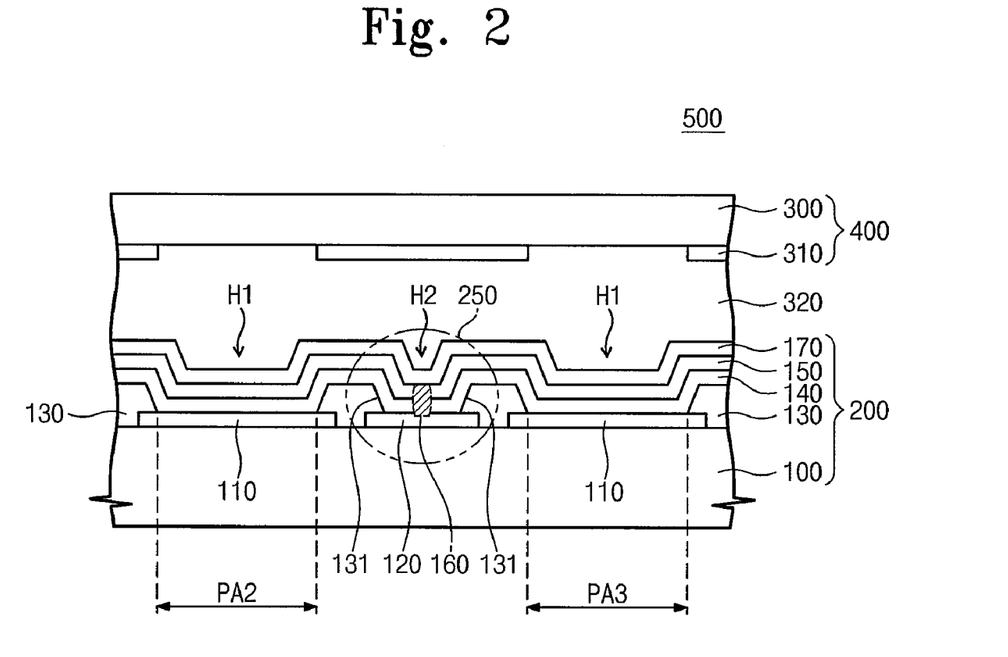
FIG. 2 is a cross-sectional view taken along a line I-I' of FIG. 1.
Figure 3:
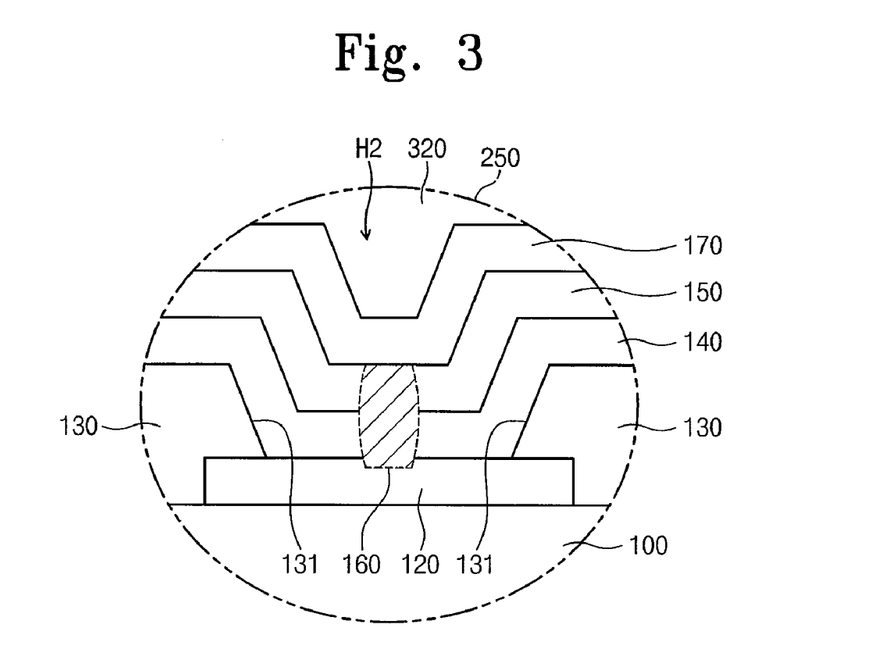
FIG. 3 is an enlarged view showing a portion of FIG. 2.

FIG. 2 is a cross-sectional view taken along a line I-I' of FIG. 1, and FIG. 3 is an enlarged view showing a portion of FIG. 2.

Referring to FIGS. 2 and 3, besides the elements shown in FIG. 1, the first substrate 200 further includes a first base substrate 100, the first electrode 110, the organic light emitting layer 140, the second electrode 150, and a protective layer 170.

The first electrode 110 is arranged on the first base substrate 100 corresponding to the second pixel area PA2 and the third pixel area PA3. Also, the first sub-electrode 120 is arranged on the first base substrate 100 corresponding to between the second pixel area PA2 and the third pixel area PA3.

The bank pattern 130 is arranged on the first base substrate 100, and the bank pattern 130 is partially removed corresponding to the second pixel area PA2 and the third pixel area PA3 to form first openings H1. In addition, the bank pattern 130 is partially removed corresponding to the first sub-electrode 120 to form the second opening H2.

The organic light emitting layer 140 is arranged on the bank pattern 130 to fill the first opening H1, and the organic light emitting layer 140 makes contact with the first electrode 110. Also, the organic light emitting layer 140 is arranged on the bank pattern 130 to fill the second opening H2. More particularly, the organic light emitting layer 140 is arranged on side portions 131 that define the second opening H2, and the organic light emitting layer 140 formed on the first sub-electrode 120 is partially removed.

The second electrode 150 is arranged on the organic light emitting layer 140. Thus, in the second pixel area PA2 and the third pixel area PA3, the first electrode 110, the organic light emitting layer 140, and the second electrode 150 are sequentially layered. When an electric potential difference is generated between the first electrode 110 and the second electrode 150, the organic light emitting layer 140 interposed between the first electrode 110 and the second electrode 150 may generate a light having a predetermined color.

Meanwhile, the reason that the organic light emitting layer 140 that is arranged on the first sub-electrode 120 is partially removed is because a laser contact part 160 that electrically connects the second electrode 150 and the first sub-electrode 120 is formed between the first sub-electrode 120 and the second electrode 150.

The laser contact part 160 is formed by partially melting the first sub-electrode 120 and the second electrode 150 and curing the melted portions of the first sub-electrode 120 and the second electrode 150. Thus, the first sub-electrode 120 and the second electrode 150 are electrically connected to each other through the laser contact part 160, and an electrical resistance of the second electrode 150 may be reduced. More detailed description of the above will be described with reference to FIGS. 10A and 10B.

In the case that the first substrate 200 does not include the first sub-electrode 120, since the second electrode 150 having a thin film thickness may have a high electrical resistance, an electrical conductivity of the second electrode 150 may decrease. However, as shown in the present embodiment, because the first substrate 200 includes the first sub-electrode 120 that is electrically connected to the second electrode 150, the electrical resistance of the second electrode 150 may be reduced by the first sub-electrode 120, thereby improving the electrical conductivity of the second electrode 150. When the electrical conductivity of the second electrode 150 is improved, a current may be easily applied to the second electrode 150 throughout the entire pixel areas PE of the organic light emitting display 500, so that a display characteristic of the organic light emitting display 500 may be improved.

Also, when the first substrate 200 includes the first sub-electrode 120 that is electrically connected to the second electrode 150, since a resistance of the second electrode 150 is reduced by the first sub-electrode 120, the second electrode 150 may have a smallthickness (e.g., a thin film thickness) in order to maximize an amount of a light that transmits through the second electrode 150 and exits to an exterior of the OLED 500.

The second electrode 150 may include a transparent conductive material, such as indium tin oxide (ITO), indium zinc oxide (IZO), and/or zinc oxide (ZnO). The reason that the second electrode 150 includes the transparent conductive material is because the organic light emitting display 500 employs a top emission method in which a light generated by the organic light emitting layer 140 exits to an exterior through the second electrode 150 and the second substrate 400.

In general, when an organic light emitting display employs a top emission method, even though a second electrode includes a transparent conductive material, it is desirable to decrease a thickness of the second electrode in order to minimize a loss of light that transmits through the second electrode. However, if the thickness of the second electrode decreases, a resistance of the second electrode increases, thereby deteriorating a display characteristic of the organic light emitting display. According to the present embodiment, since the second electrode 150 is electrically connected to the first sub-electrode 120 through the laser contact part 160 to reduce the resistance of the second electrode 150, the second electrode 150 may be thin in thickness, to thereby improve a transmittance of the second electrode 150.

As described above, the organic light emitting display 500 employs the top emission method. However, the organic light emitting display 500 may employ the bottom emission method to generate the light. In the case that the organic light emitting display 500 employs the bottom emission method, the light generated by the organic light emitting layer 140 is reflected by the second electrode 150 and exits to an exterior through the first substrate 200, and thus the second electrode 150 may include a metal material, such as aluminum, and the first electrode 110 may include a transparent conductive material.

As shown in FIG. 1, in the present embodiment, the organic light emitting layer 140 generates a white light, however, the organic light emitting display 500 may display red, blue or green light besides the white light. In order to display other colors besides the white color, the organic light emitting display 500 may further include color filters (not shown) corresponding to the second and third pixel areas PA2 and PA3. In the case that the organic light emitting display 500 further includes the color filters, the color filters may be arranged on the second electrode 150 corresponding to the second and third pixel areas PA2 and PA3, respectively, or the color filters may be arranged on a second base substrate 300 corresponding to the second and third pixel areas PA2 and PA3, respectively.

The protective layer 170 is arranged on the second electrode 150. The protective layer 170 protects the organic light emitting layer 140 from humidity and/or oxygen. The protective layer 170 may include an organic material such as phenylene, and/or an insulating material such as silicon oxide (SiOx), silicon nitride (SiNx), and silicon oxynitride (SiON).

The second substrate 400 includes a second base substrate 300, a black matrix 310 arranged on the second base substrate 300, and a filling layer 320 arranged on the second base substrate 300 to cover the black matrix 310.

The filling layer 320 maintains a cell gap of the organic light emitting display 500. Advantageously, even though the organic light emitting display 500 becomes large in size, the filling layer 320 may easily maintain the cell gap of the organic light emitting display 500 over the entire surface of the organic light emitting display 500.

The filling layer 320 includes a transparent insulating material. As the filling layer 320 becomes more transparent, the amount of the light generated by the organic light emitting layer 140 and exiting to an exterior through the second substrate 400 may increase.

In addition, the filling layer 320 prevents foreign substances (not shown) that may be generated around a laser contact area 250 from being diffused between the first substrate 200 and the second substrate 400. The foreign substances may be generated during a forming process of the laser contact part 160. More particularly, when a laser beam is irradiated onto the second opening H2 to form the laser contact part 160, the thin films formed on the first base substrate 100 corresponding to the second opening H2 are burned in part by the laser beam, so that foreign substances may be generated. The foreign substances have a tendency to move upward to the laser contact part 160 and to be diffused between the first substrate 200 and the second substrate 400 toward the second and third pixel areas PA2 and PA3. However, since an area between the first substrate 200 and the second substrate 400 is filled with the filling layer 320, the foreign substances may be prevented from being diffused.

Figure 4:
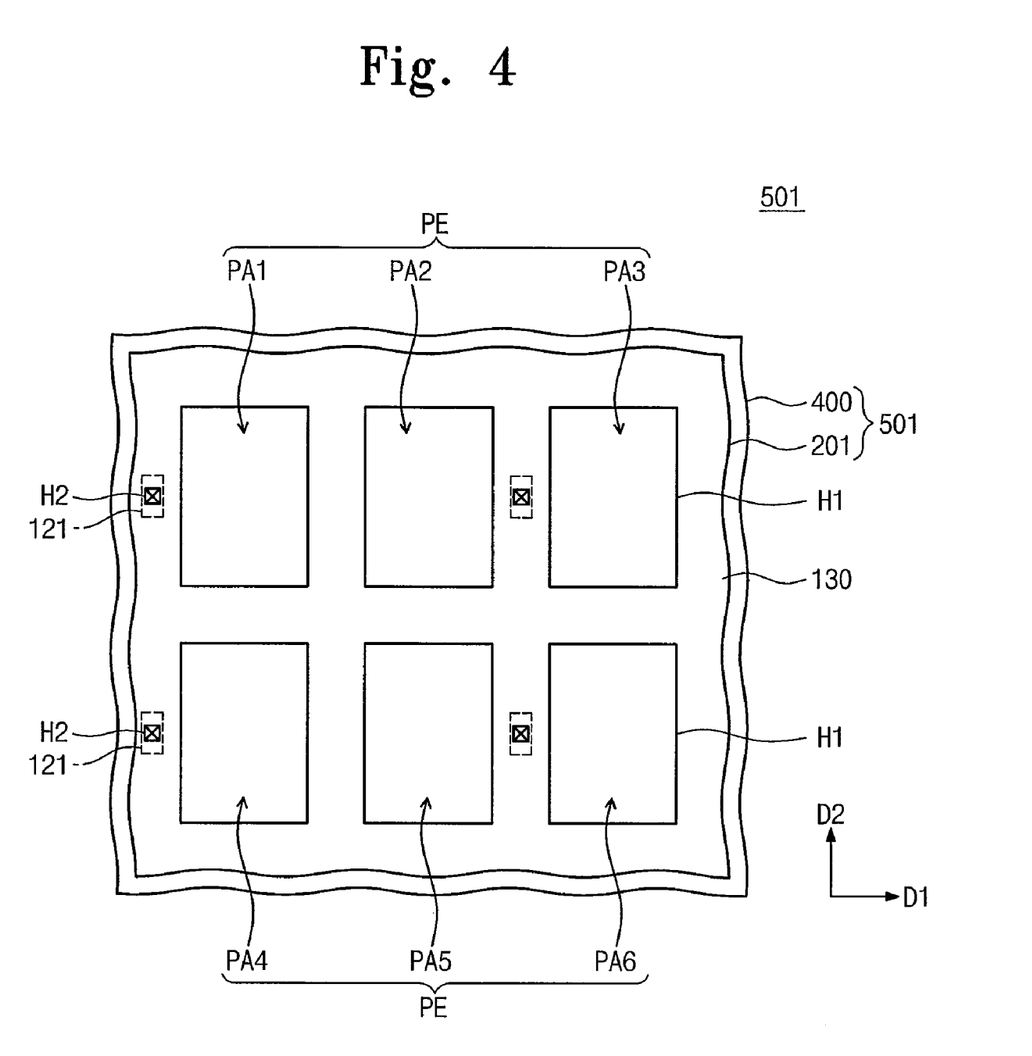
FIG. 4 is a cross-sectional view showing another embodiment of an organic light emitting display according to the present invention.

FIG. 4 is a cross-sectional view showing another embodiment of an organic light emitting display according to the present invention. In FIG. 4, the same reference numerals denote the same elements in FIGS. 1 to 3, and thus the detailed descriptions of the same elements will be omitted.

Referring to FIG. 4, when comparing the organic light emitting display 500 shown in FIG. 1 with the organic light emitting display 501 shown in FIG. 4, the organic light emitting display 501 includes first sub-electrodes 121 that are spaced apart from each other. More particularly, a first substrate 201 includes pixel areas PE defined thereon, and the first sub-electrodes 121 spaced apart from each other are arranged in an area outside the pixel areas PE.

In the same manner as the first sub-electrode 120 shown in FIGS. 1 to 3, the first sub-electrodes 121 are electrically connected to a second electrode (not shown) through second openings H2. Thus, the first sub-electrodes 121 may reduce a resistance of the second electrode.

In the area outside of the pixel areas PE, a number of the first sub-electrodes 121 that are arranged on the first substrate 201 may decrease or increase. For instance, as shown in FIG. 4, the first sub-electrodes 121 are not arranged in an area between the first pixel area PA1 and the second pixel area PA2, however, the first sub-electrodes 121 may be further arranged in the area between the first pixel area PA1 and the second pixel area PA2 in order to further reduce the resistance of the second electrode.

In addition, the first sub-electrode 121 has a rectangular shape in a plan view as shown in FIG. 4, however, the first sub-electrodes 121 may have different shapes other than the rectangular shape.

Figure 5:
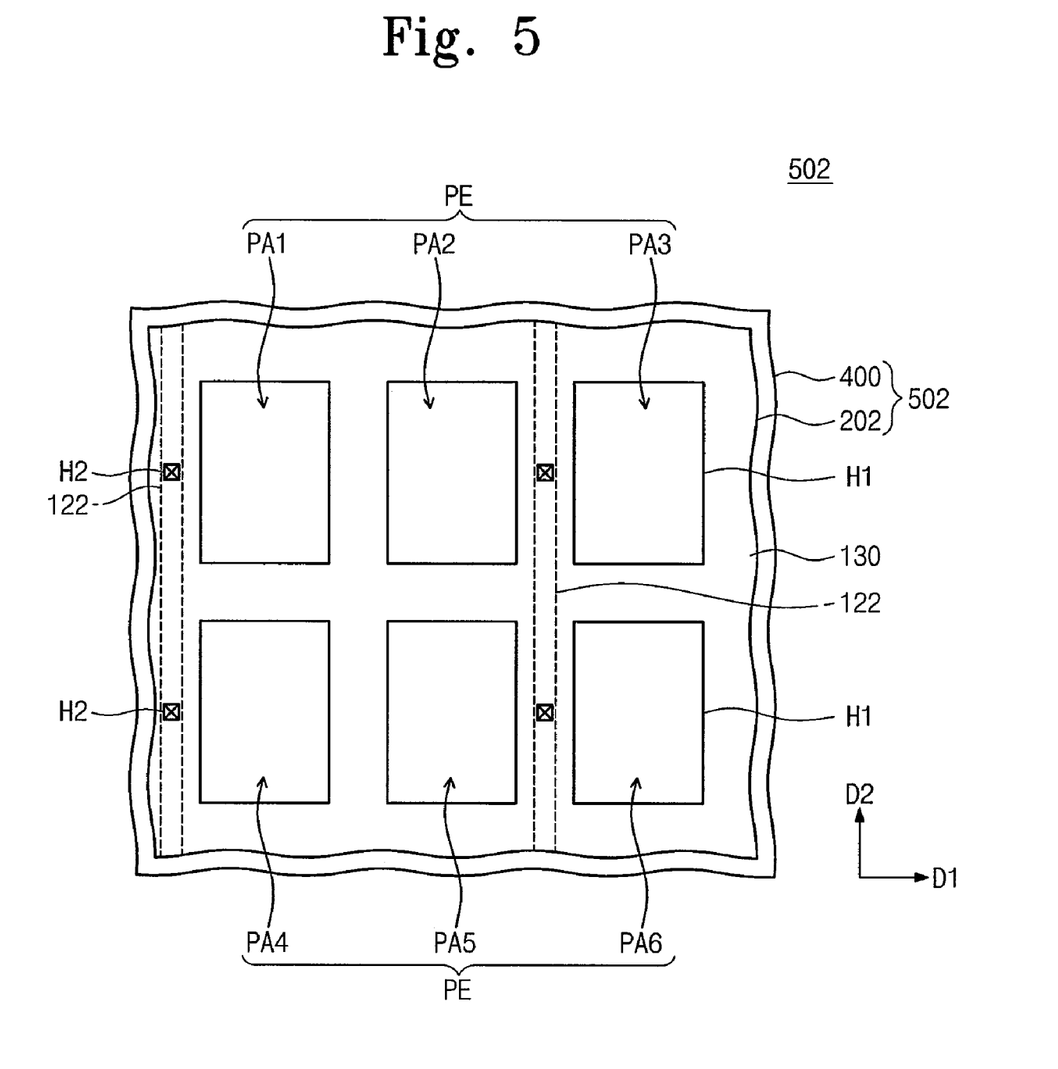
FIG. 5 is a plan view showing another embodiment of an organic light emitting display according to the present invention.

FIG. 5 is a plan view showing another embodiment of an organic light emitting display according to the present invention. In FIG. 5, the same reference numerals denote the same elements in FIGS. 1 to 3, and thus the detailed descriptions of the same elements will be omitted.

Referring to FIG. 5, when comparing the organic light emitting display 500 shown in FIG. 1 with the organic light emitting display 502 shown in FIG. 5, the organic light emitting display 502 includes first sub-electrodes 122 that extend in a second direction D2 (e.g., a stripe shape). More particularly, a first substrate 202 includes pixel areas PE defined thereon, and the first sub-electrodes 122 are arranged in an area outside the pixel areas PE and extend along the second direction D2.

Similar to the first sub-electrode 120 shown in FIGS. 1 to 3, the first sub-electrodes 122 are electrically connected to a second electrode (not shown) through second openings H2. Thus, the first sub-electrodes 122 may reduce a resistance of the second electrode.

As shown in FIG. 5, the first sub-electrodes 122 extend along the second direction D2 in the area outside the pixel areas PE such that the first sub-electrodes 122 have the stripe shape. However, the first sub-electrodes 122 may extend in a first direction D1 that is substantially perpendicular to the second direction D2.

Figure 6:
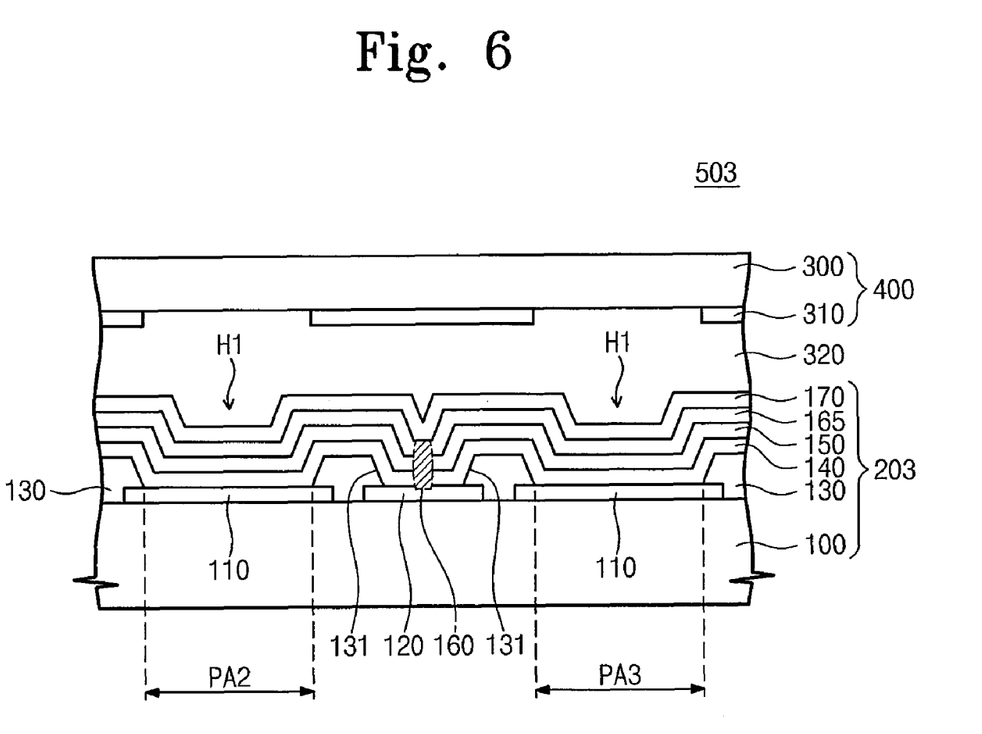
FIG. 6 is a cross-sectional view showing another embodiment of an organic light emitting display according to the present invention.

FIG. 6 is a cross-sectional view showing another embodiment of an organic light emitting display according to the present invention. In FIG. 6, the same reference numerals denote the same elements in FIGS. 1 to 3, and thus the detailed descriptions of the same elements will be omitted.

Referring to FIG. 6, when comparing the organic light emitting display 500 shown in FIG. 2 with an organic light emitting display 503 shown in FIG. 6, a first substrate 203 further includes a second sub-electrode 165 that is interposed between a second electrode 150 and a protective layer 170.

The second sub-electrode 165 is arranged on the second electrode 150 to make contact with the second electrode 150, and thus the second sub-electrode 165 is electrically connected to the second electrode 150 to reduce a resistance of the second electrode 150.

The second sub-electrode 165 may include a transparent conductive material, such as indium tin oxide (ITO), indium zinc oxide (IZO), and/or zinc oxide (ZnO). In addition, the second sub-electrode 165 has a thickness of about 10 angstroms to about 1,000,000 angstroms in one example. As the thickness of the second sub-electrode 165 increases, the resistance of the second electrode 150 may be reduced.

FIGS. 7A, 8A, 9A, and 10A are plan views illustrating a method of manufacturing the organic light emitting display of FIG. 1, and FIGS. 7B, 8B, 9B, and 10B are cross-sectional views taken along lines I-I' of FIGS. 7A, 8A, 9A, and 10A, respectively. In FIGS. 7A to 10A and 7B to 10B, the same reference numerals denote the same elements in FIGS. 1 and 2, and thus the detailed descriptions of the same elements will be omitted.

Figure 7A:
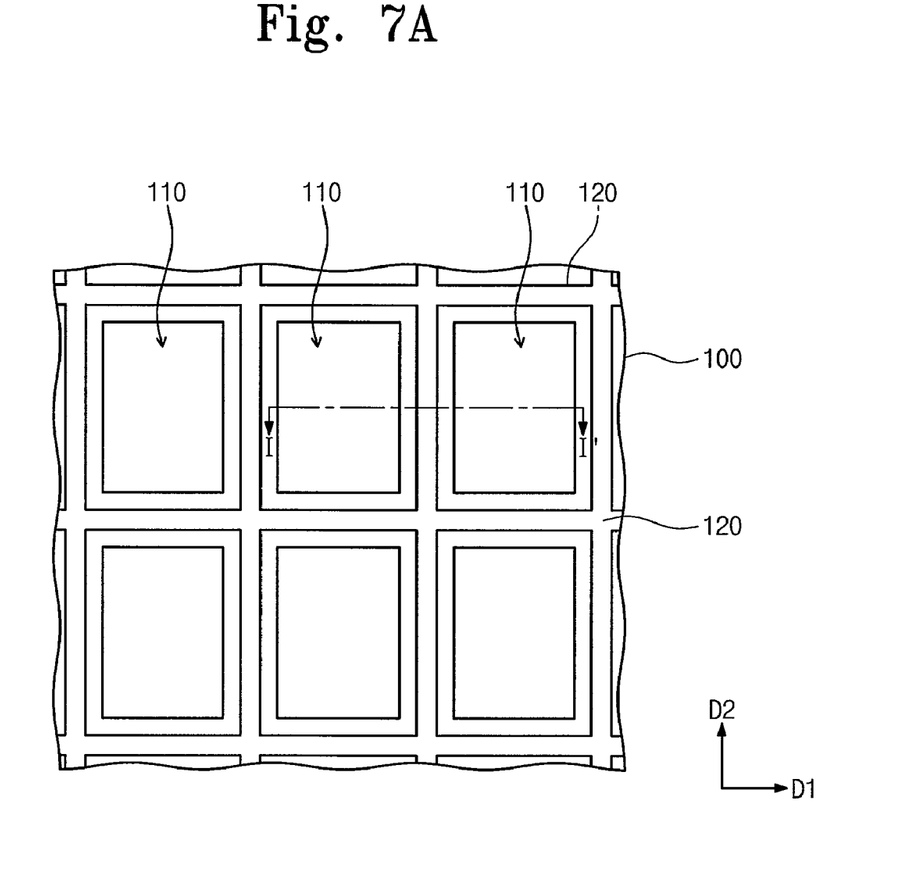
FIGS. 7A, 8A, 9A, and 10A are plan views illustrating a method of manufacturing the organic light emitting display of FIG. 1.
Figure 7B:
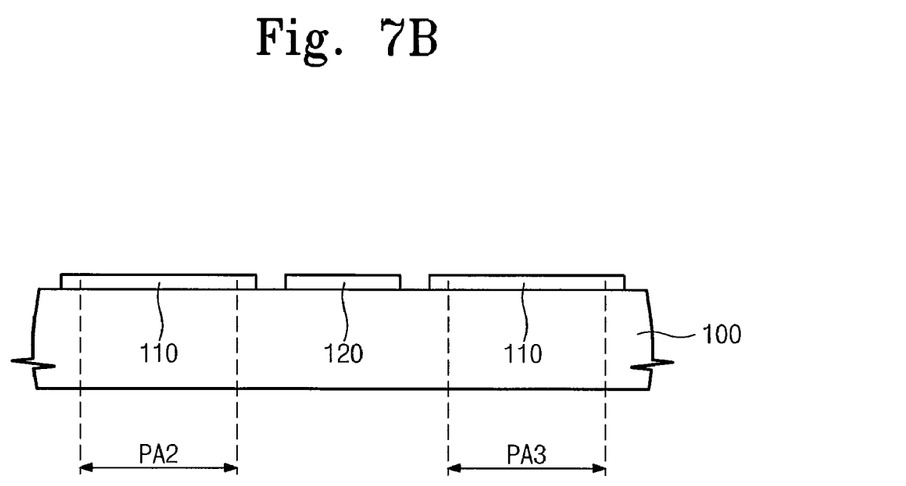
FIGS. 7B, 8B, 9B, and 10B are cross-sectional views taken along lines I-I' of FIGS. 7A, 8A, 9A, and 10A, respectively.

Referring to FIGS. 7A and 7B, a first electrode 110 and a first sub-electrode 120 are formed on a first base substrate 100. The first electrode 110 is arranged in a matrix shape. That is, the first electrode 110 is arranged along a first direction D1 and a second direction D2 that is substantially perpendicular to the first direction D1. Also, the first sub-electrode 120 extends in the first direction D1 and the second direction D2 and is formed to surround the first electrode 110. Thus, the first sub-electrode 120 does not overlap the first electrode 110 in a plan view, thereby being spaced apart from the first electrode 110.

Figure 8A:
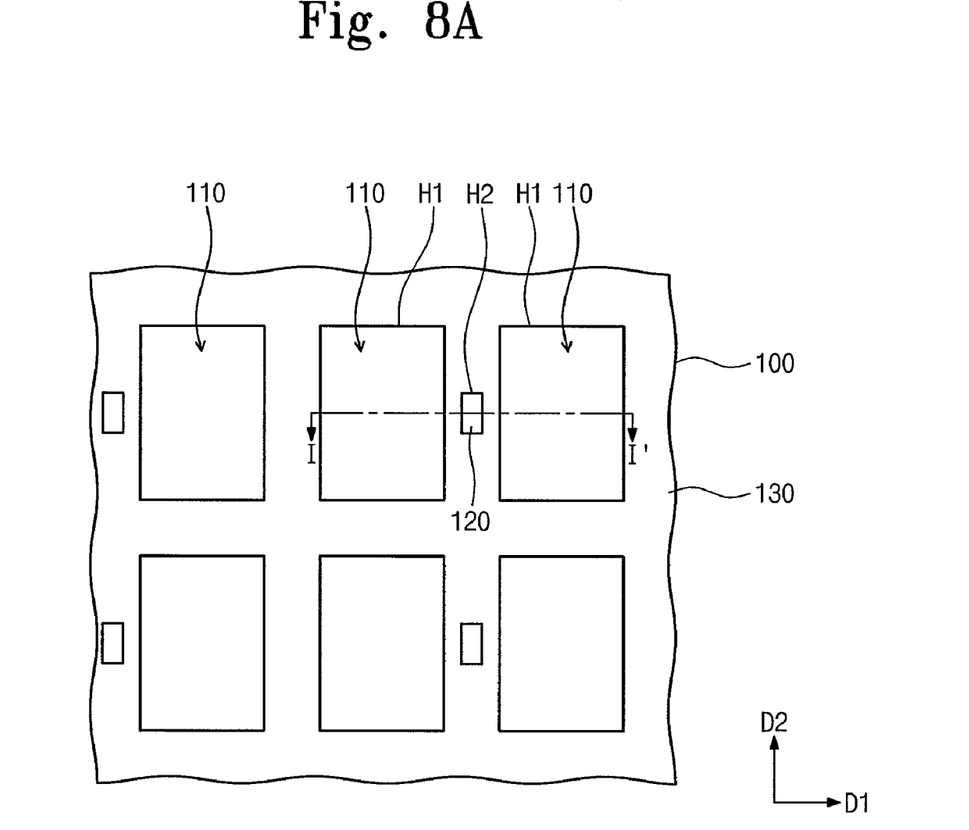
Figure 8B:
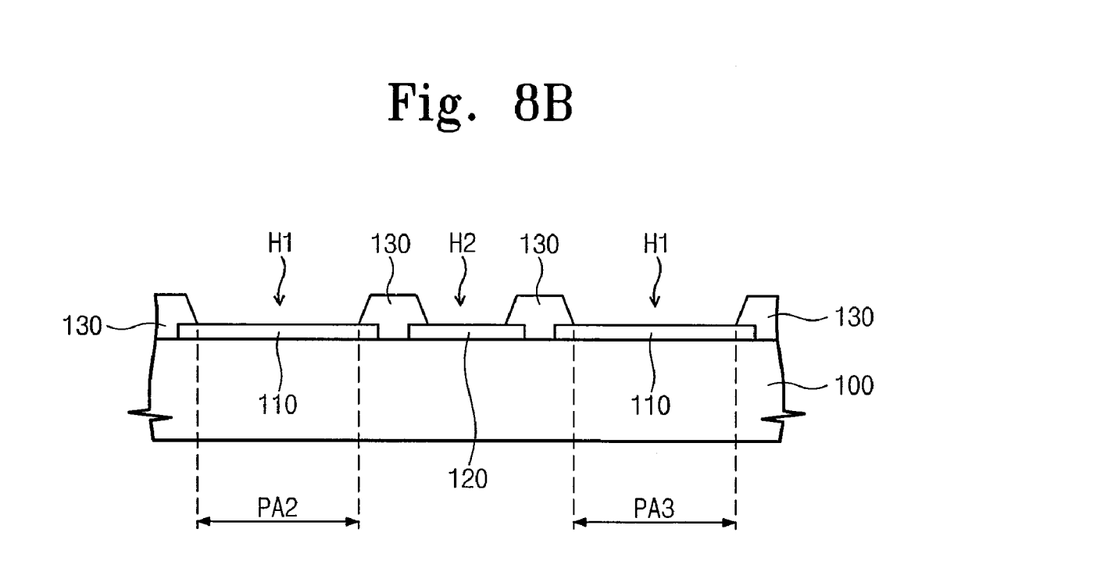

Referring to FIGS. 8A to 8B, after forming the first electrode 110 and the first sub-electrode 120 on the first base substrate 100, a bank pattern 130 including a first opening H1 and a second opening H2 is arranged on the first base substrate 100. More particularly, the first opening H1 of the bank pattern 130 corresponds to the first electrode 110, and the second opening H2 of the bank pattern 130 corresponds to the first sub-electrode 120. Thus, the first electrodes 110 are exposed to an exterior through the first opening H1, and the first sub-electrode 120 is exposed to the exterior through the second opening H2.

Figure 9A:
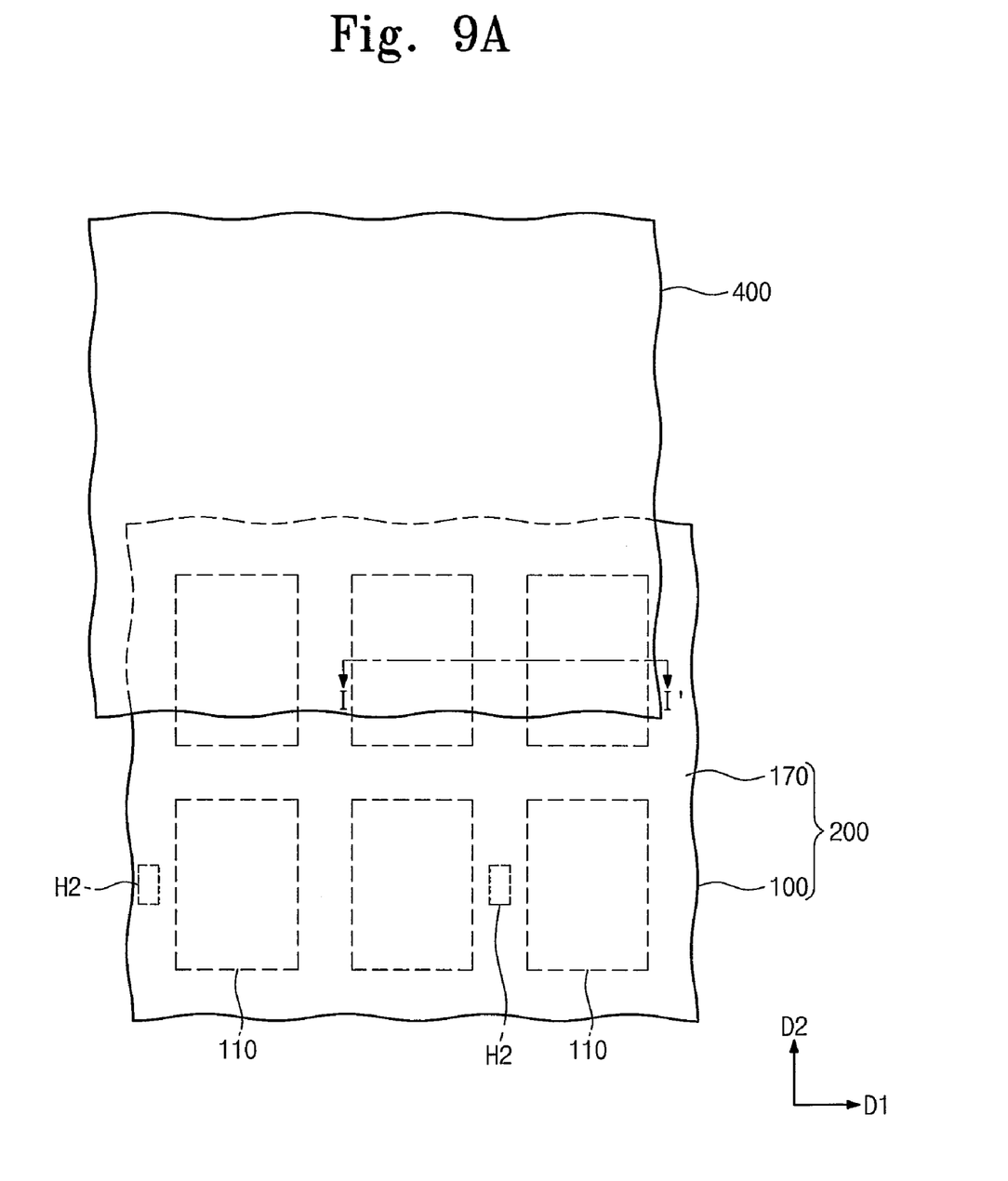
Figure 9B:
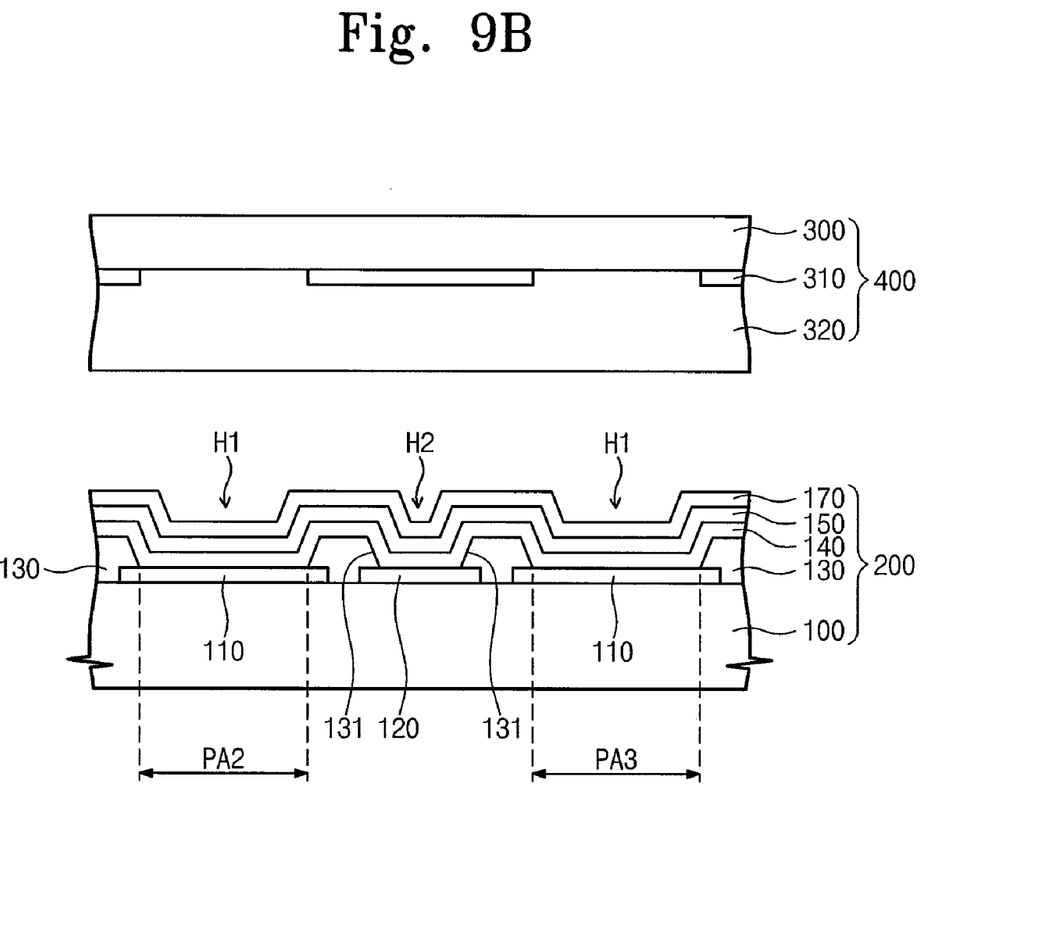

Referring to FIGS. 9A and 9B, an organic light emitting layer 140, a second electrode 150, and a protective layer 170 are sequentially formed on the bank pattern 130. Therefore, the organic light emitting layer 140 is formed on the first electrode 110 that is exposed through the first opening H1, and the organic light emitting layer 140 is formed on the first sub-electrode 120 that is exposed through the second opening H2.

Also, a black matrix 310 is formed on a second base substrate 300, and a filling layer 320 is formed on the second base substrate 300 to cover the black matrix 310. The filling layer 320 is formed by applying a transparent liquid-type insulating material on the second base substrate 300 and curing the transparent liquid-type insulating material using light or heat.

When the first substrate 200 is combined with the second substrate 400, the filling layer 320 uniformly maintains a distance between the first substrate 200 and the second substrate 400. Also, since the filling layer 320 has low humidity transmissivity and low oxygen transmittance, the filling layer 320 that covers the organic light emitting layer 140 may prevent a light emitting characteristic of the organic light emitting layer 140 from being deteriorated due to humidity and/or oxygen.

Figure 10A:
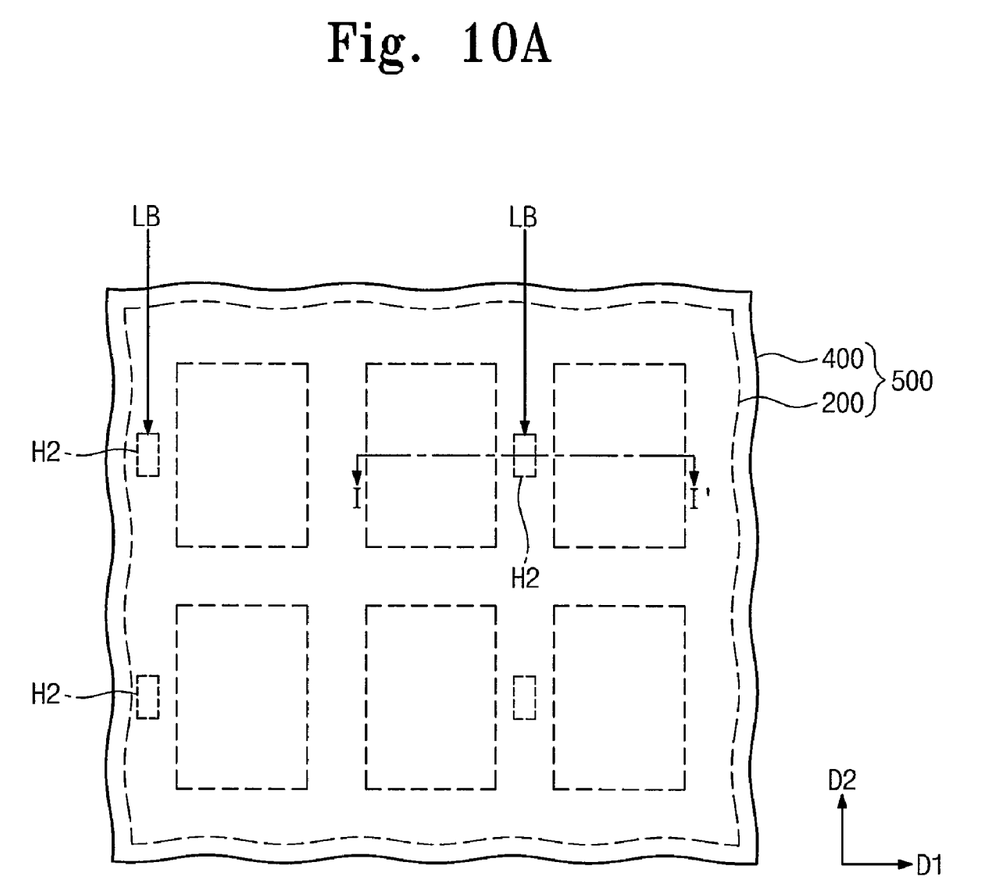
Figure 10B:
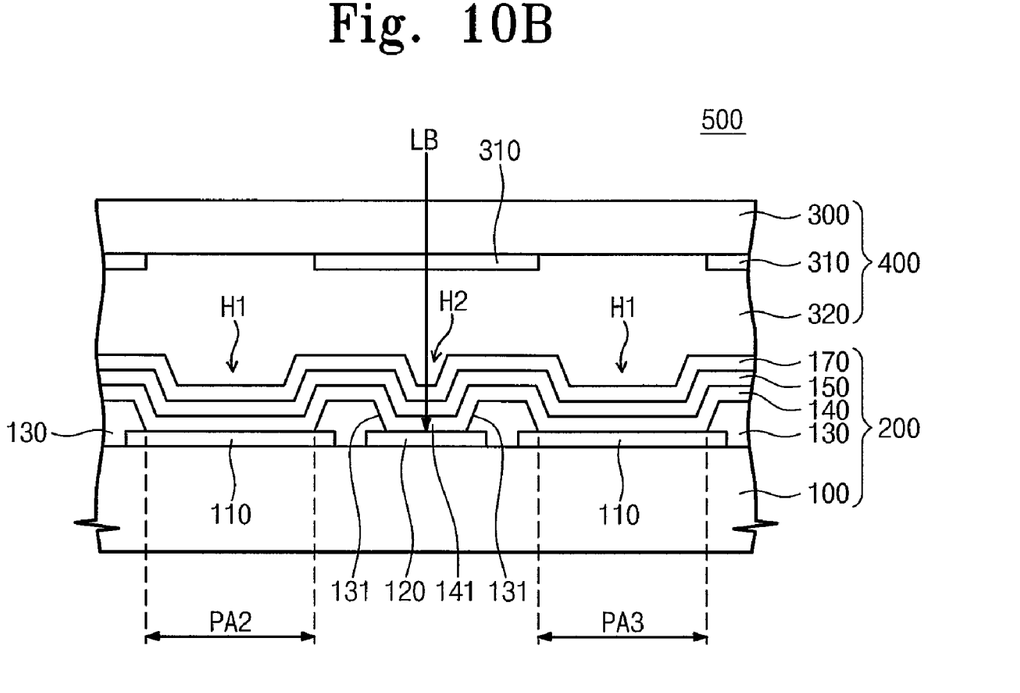

Referring to FIGS. 10A and 10B, the first substrate 200 is combined with the second substrate 400 such that the first substrate 200 faces the second substrate 400.

After the first substrate 200 is combined with the second substrate 400, the filling layer 320 is cured by using heat or light, and a laser beam LB is irradiated onto the second opening H2. As a result, a portion 141 of the organic light emitting layer 140 filled in the second opening H2 is removed by the laser beam LB, and the first sub-electrode 120 and the second electrode 150 adjacent to the removed portion 141 of the organic light emitting layer 140 are partially melted.

Meanwhile, during irradiation of the laser beam LB onto the second opening H2, the protective layer 170 or the organic light emitting layer 140 may be burned by the laser beam LB, so that foreign substances (not shown) may be generated. However, since the area between the first substrate 200 and the second substrate 400 is filled by the filling layer 320, the foreign substances may be prevented from being diffused between the first substrate 200 and the second substrate 400.

Referring again to FIG. 2, after the irradiation of the laser beam LB onto the second opening H2 is completed, portions of the first sub-electrode 120 and the second electrode 150, which are melted by the laser beam LB (shown in FIG. 10B), are cured to form the laser contact part 160. As a result, the second electrode 150 is electrically connected to the first sub-electrode 120 by the laser contact part 160.

According to the above, since the second electrode is electrically connected to the first sub-electrode by using irradiation of the laser beam, an electrical resistance of the second electrode is reduced, thereby improving an electrical conductivity of the second electrode. In addition, since an area between the first substrate and the second substrate is filled by a filling layer, foreign substances generated during the irradiation of the laser beam may be prevented from being diffused between the first substrate and the second substrate.

Although the embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An organic light emitting display comprising: a first substrate; a second substrate facing the first substrate; a first electrode disposed on the first substrate; a first sub-electrode disposed on the first substrate and spaced apart from the first electrode; a bank pattern, including a first opening corresponding to the first electrode and a second opening corresponding to the first sub-electrode, the bank pattern being disposed on the first substrate; an organic light emitting layer disposed in the first opening and the second opening; and a second electrode disposed on the organic light emitting layer, wherein the organic light emitting layer is contacted to the first sub-electrode: wherein a plurality of pixel areas is defined on the first substrate, the first opening is formed in each pixel area, and the first sub-electrode is disposed in an area outside the pixel areas, further comprising a laser contact part disposed in the second opening to electrically connect the first sub-electrode and the second electrode.

2. The organic light emitting display of claim 1, wherein the organic light emitting layer disposed in the second opening is partially removed.

3. The organic light emitting display of claim 1, further comprising a filling layer interposed between the first substrate and the second substrate.

4. The organic light emitting display of claim 3, wherein the filling layer is arranged at an uppermost portion of the second substrate.

5. The organic light emitting display of claim 3, wherein the filling layer prevents a foreign substance positioned in an area adjacent to the second opening from being diffused between the first substrate and the second substrate.

6. The organic light emitting display of claim 1, further comprising a second sub-electrode that is disposed on the second electrode and electrically connected to the second electrode.

7. The organic light emitting display of claim 6, wherein the second sub-electrode includes a transparent conductive material comprised of indium tin oxide (ITO) or indium zinc oxide (IZO) or zinc oxide (ZnO).

8. The organic light emitting display of claim 6, further comprising a protective layer disposed on the second sub-electrode.

9. The organic light emitting display of claim 8, wherein the protective layer includes an organic material comprised of phenylene, or an insulating material comprised of silicon oxide or silicon nitride or silicon oxynitride (SiON).

* * * * *